(12) United States Patent
Kunst

(10) Patent No.: US 7,978,558 B2
(45) Date of Patent: Jul. 12, 2011

(54) IN-CIRCUIT PROGRAMMING OF OUTPUT VOLTAGE AND OUTPUT CURRENT CHARACTERISTICS OF A PSR POWER SUPPLY

(75) Inventor: David J. Kunst, Cupertino, CA (US)

(73) Assignee: Active-Semi, Inc. (VG)

( * ) Notice: Subject to any disclaimer, the term of this patent is extended or adjusted under 35 U.S.C. 154(b) by 771 days.

(21) Appl. No.: 12/079,039

(22) Filed: Mar. 24, 2008

(65) Prior Publication Data

US 2009/0237063 A1    Sep. 24, 2009

(51) Int. Cl.
*G11C 7/00* (2006.01)
(52) U.S. Cl. .......................... 365/226; 365/201; 365/240
(58) Field of Classification Search .................. 365/226, 365/201, 240; 323/282; 363/21.16
See application file for complete search history.

(56) References Cited

U.S. PATENT DOCUMENTS

| | | | |
|---|---|---|---|
| 5,781,000 A | 7/1998 | Saeki et al. | 323/234 |
| 6,005,377 A | 12/1999 | Chen et al. | 323/283 |
| 6,618,711 B1 | 9/2003 | Ananth | 706/14 |
| 6,750,640 B2 | 6/2004 | Balakrishnan et al. | 323/314 |
| 7,203,079 B2 | 4/2007 | Yang et al. | 363/41 |
| 2004/0189388 A1* | 9/2004 | Nguyen et al. | 330/254 |
| 2006/0025892 A1 | 2/2006 | Leung et al. | 700/293 |
| 2006/0186955 A1 | 8/2006 | Quilter | 330/10 |
| 2008/0007982 A1* | 1/2008 | Piper et al. | 363/97 |

* cited by examiner

*Primary Examiner* — Son T Dinh
(74) *Attorney, Agent, or Firm* — Imperium Patent Works; T. Lester Wallace; Darien K. Wallace

(57) ABSTRACT

A primary-side regulation (PSR) controller integrated circuit includes a PSR CC/CV controller and a non-volatile shift register. An assembled power supply that includes the integrated circuit is in-circuit tested to determine errors in power supply output voltage and/or current. Programming information is determined and shifted into the shift register. During programming, the power supply regulates to a different output voltage, and the different voltage is used for shift register programming. After programming, the power supply operates in a normal mode so that the output voltage and current are within specification. The voltage and current to which the power supply regulates are set by some of the bits of the programming information. Other of the bits set error correction circuits of the PSR CC/CV controller such as a primary inductance variation compensation circuit, a line input voltage variation compensation circuit, an efficiency variation compensation circuit, and a cord resistance compensation circuit.

27 Claims, 12 Drawing Sheets

IN-CIRCUIT TEST AND PROGRAMMING OF
AN ASSEMBLED PSR CC/CV POWER SUPPLY

IN-CIRCUIT TEST AND PROGRAMMING OF
AN ASSEMBLED PSR CC/CV POWER SUPPLY

| BITS | FUNCTION |
|---|---|
| DOUT[0:3] | SET FREQUECY OF PCLK, ON/OFF JITTER OF PCLK |
| DOUT[4:7] | SET VREF (USABLE TO ADJUST VOUT AND IOUT) |
| DOUT[8:11] | SET R1 (USABLE TO ADJUST VOUT) |
| DOUT[12:15] | SET R2 (USABLE TO ADJUST VOUT) |
| DOUT[16:19] | SET R4 (USABLE TO ADJUST IOUT) |
| DOUT[20:23] | SET R5 IN CC1 (USABLE TO CORRECT FOR EFFICIENCY VARIATION) |
| DOUT[24:27] | SET R10 IN CC2 (USABLE TO CORRECT FOR VIN LINE VARIATION) |
| DOUT[28:31] | SET R7 IN CC3 (USABLE TO CORRECT FOR CORD RESISTANCE) |

PROGRAMMABLE BITS

FIG. 7

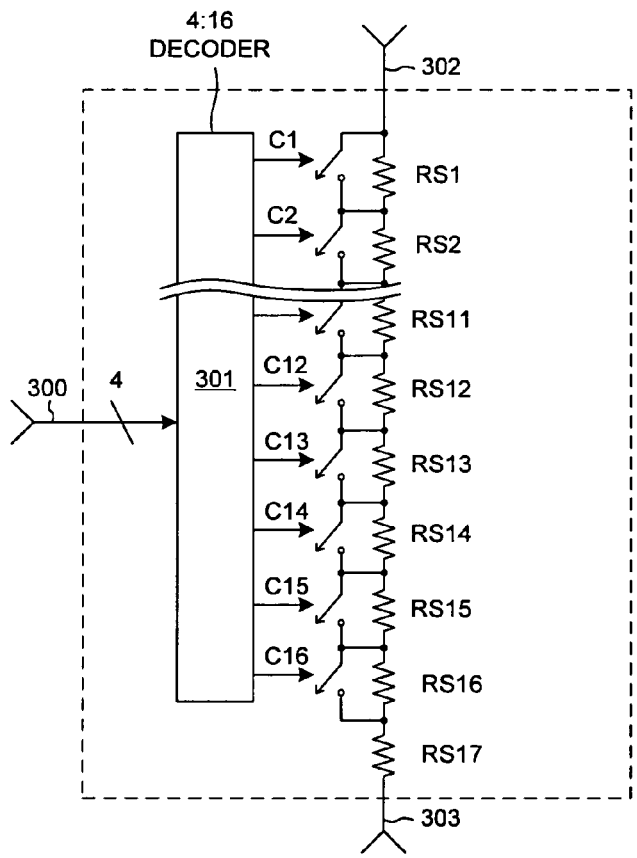

PROGRAMMABLE RESISTOR

FIG. 8

ENTERING PROGRAM MODE, AND LOADING DATA SYNCHRONOUSLY WITH SW, AND INCREASING VDD SO THAT VDD CAN SERVE AS A PROGRAMMING VOLTAGE

NON-VOLATILE CELL BIT STRUCTURE

IN CONSTANT CURRENT MODE, $IOUT = \dfrac{\frac{1}{2}\eta \cdot LP \cdot IP^2 \cdot fs}{VOUT}$

IOUT ADJUST AND CORRECTION CIRCUITRY

VOUT CORD RESISTANCE COMPENSATION CIRCUIT

IN-CIRCUIT PROGRAMMING OF OUTPUT VOLTAGE AND OUTPUT CURRENT CHARACTERISTICS OF A PSR POWER SUPPLY

TECHNICAL FIELD

The present disclosure relates generally to primary-side regulation (PSR) power supplies and PSR controller integrated circuits.

BACKGROUND INFORMATION

FIG. 1 (Prior Art) is a block diagram of primary-side regulation constant current/constant voltage (PSR CC/CV) flyback power supply 1. An alternating current (AC) 110-240 volt line voltage on input terminals 2 and 3 is rectified by a full wave bridge rectifier 4 and an associated smoothing capacitor 5 so that a rectified and smoothed rough DC voltage is present between the first and second input nodes 6 and 7. The voltage on first input node 6 is also referred to in this document as the "input line voltage" or "line input voltage" (VIN).

Power supply 1 operates by repeatedly closing and opening a switch. In the illustrated example, the switch is a bipolar transistor 8. Closing switch 8 causes a primary current to flow from node 6, through a primary 9 of a transformer 23, through switch 8, into terminal 10 of a PSR CC/CV controller integrated circuit 11, through another switch (not shown) inside the PSR CC/CV controller integrated circuit 11, and from the ground terminal 12 of the PSR CC/CV controller integrated circuit 11 to the second input node 7. When switch 8 is closed, the current that flows through primary 9 causes energy to be stored in transformer 23. When switch 8 is opened, the energy stored is transferred to the output of the power supply in the form of a pulse of current that flows through a secondary 13 of transformer 23 and through a diode 14. An output capacitor 15 is connected across output terminals 16 and 17 of the power supply. The pulse of current charges capacitor 15. In steady state operation in the constant voltage (CV) mode, switch 8 is switched to open and close rapidly and in such a manner that the output voltage VOUT on capacitor 15 remains substantially constant at a desired regulated output voltage. The output voltage VOUT is related to the voltage VAUX across an auxiliary winding 18. VAUX is divided by a voltage divider including resistors 19 and 20 so that the voltage on the voltage divider tap 21 is sensed on an FB terminal 22 of PSR CC/CV controller integrated circuit 11. PSR CC/CV controller integrated circuit 11 has an internal reference voltage generator that generates a reference voltage VREF. Controller integrated circuit 11 regulates VOUT to have the desired regulated output voltage by keeping the voltage on FB terminal 22 equal to the internal reference voltage VREF.

The current IOUT being supplied from the output of the power supply is related to the current flowing through primary 9. In the constant-current (CC) operating mode, the magnitude of the primary current is detected by detecting the voltage across the switch (not shown) inside PSR CC/CV controller integrated circuit 11. This voltage, which is the product of the current flow in the switch and the resistance of the switch, is sensed and amplified by a current sense amplifier inside PSR CC/CV controller integrated circuit 11. The output current IOUT is regulated to a desired regulated output current by keeping the peak voltage detected by the current sense amplifier equal to a reference voltage value VILIM.

In the example of FIG. 1, power supply 1 is a battery charger such as a battery charger usable to charge the rechargeable batteries of a cellular telephone. The AC line in terminals 2 and 3 are typically plugged into a wall socket to receive alternative current (AC) 110-240 VAC power. The two terminals 16 and 17 at the end of a cord are plugged into the cellular telephone. Initially, if the batteries in the cellular telephone are discharged, then the battery charger operates in the constant current (CC) mode and supplies charging current at the regulated current amount (in the present example, 1 ampere). Then, once the batteries have charged to the point that the output voltage VOUT reaches the desired regulated voltage (in the present example, 5 volts), the power supply 1 starts operating in the constant voltage (CV) mode. PSR CC/CV power supply 1 then regulates such that the output voltage VOUT stays at the desired regulated output voltage while the supplied output current decreases.

FIG. 2 (Prior Art) is a graph of output voltage VOUT versus output current IOUT. Initially when PSR CC/CV power supply 1 is operating in the CC mode, the output voltage and current operating point of the power supply lies on line 24. The point migrates vertically up line 24 as the voltage on the battery increases as the battery charges. When the point reaches corner 25, the power supply transitions to the CV mode. The point representing the output voltage and output current migrates to the left along horizontal line 26.

The graph of FIG. 2 is, however, an idealization. In an actual PSR CC/CV power supply, lines 24 and 26 are not followed. The output voltage and current points may extend away from lines 24 and 26 so much that the actual power supply operating point is outside a specified permitted operating range. In the example of FIG. 2, for the power supply to meet a particular specification and standard, the output current IOUT in the CC mode must be within plus or minus ten percent of the regulated output current of 1.0 amperes. Similarly, the output voltage VOUT in the CV mode must be within plus or minus five percent of the regulated output voltage of 5.0 volts.

There are many potential reasons that the actual power supply operating point may be outside of the specified bounds. Different units of the PSR CC/CV controller integrated circuit may be affected in different ways by the semiconductor manufacturing process used to make the integrated circuits and by the process used to package the integrated circuits. U.S. Pat. No. 6,750,640 teaches that after controller integrated circuits have been tested at "wafer sort", that their operation from unit to unit can be affected to different degrees by the packaging process. For example, U.S. Pat. No. 6,750,640 teaches that power supply controller chips can be trimmed or adjusted after "wafer sort" and after packaging at "final test" of the integrated circuits.

FIG. 3 (Prior Art) is a replication of FIG. 1 from U.S. Pat. No. 6,750,640. At integrated circuit final test, programmable circuit connections within the integrated circuit are programmed to trim or adjust certain functions of the power supply controller chip such as over voltage threshold, under voltage threshold, external current limit, maximum duty cycle and power supply enable/disable. Although the circuit of FIG. 3 is satisfactory in certain respects, it is undesirable and/or unsatisfactory in other ways. Circuitry outside the controller integrated circuit may have electrical characteristics that are seen to differ, from power supply unit to power supply unit, such that these differences cause different units of seemingly identical mass produced power supplies to exhibit output voltage and output current operating points outside of the specified limits of FIG. 2. For example, some manufactured power supply units may operate along line 27 under certain operating conditions (see FIG. 4), whereas other units may operate along line 28 (see FIG. 4). Also, under some operating conditions, some power supply units may operate along line 29. The mass produced transformers used to make the power supplies may, for example, have primary inductances that vary from one transformer to the next. Also, mass produced power cords may have resistances that differ from each other. Such differing inductances and resistances may lead to different manufactured power supply units operating outside required bounds as illustrated in FIG. 4, even if the controller integrated circuit 11 is adjusted at final test. Moreover, it may be desired to use the same controller integrated circuit and power supply design but to attach different power cords to different units of the power supply. Some units may be made to have long cords, whereas other units may be made to have short cords. Regardless of such variations, it is desired that all the assembled power supplies supply power at the end terminals of the power cord that is within the specified five percent and ten percent bounds illustrated in FIG. 4.

SUMMARY

A novel primary-side regulation (PSR) controller integrated circuit includes a PSR CC/CV controller and a non-volatile shift register. An assembled power supply that includes the novel PSR CC/CV integrated circuit is in-circuit tested to determine errors in output voltage and/or output current of the power supply. Programming information is then determined. The integrated circuit is put into a program mode, and the determined programming information is shifted into the integrated circuit and into the non-volatile shift register. The programming information is then automatically programmed into the non-volatile shift register. During the program mode, the power supply regulates to either a higher or lower voltage than it does in normal mode and this higher or lower voltage is used as a programming voltage to program the non-volatile shift register. The type of non-volatile memory and particular integrated circuit wafer manufacturing process determines whether the programming voltage is higher or lower than the normal mode voltage.

After programming, when the assembled power supply is used and operates in normal mode, the programming information in the non-volatile shift register sets or controls circuitry in the PSR CC/CV controller integrated circuit such that the output voltage and output current of the power supply are within specification. Some of the bits of the programming information set the voltage to which the output voltage is regulated. Other bits of the programming information set the current to which the output current is regulated. Other bits of the programming information set or control error correction circuits of the PSR CC/CV controller such as a primary inductance variation compensation circuit, a line input voltage variation compensation circuit, an efficiency variation compensation circuit, and a cord resistance compensation circuit.

Other structures and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 7 is a table that sets forth functions controlled by the various bits of programming information shifted into the non-volatile shift register 204 of FIG. 6.

FIG. 8 is a diagram that illustrates one way that the programmable resistors of FIG. 6 can be realized.

DETAILED DESCRIPTION

Reference will now be made in detail to some embodiments of the invention, examples of which are illustrated in the accompanying drawings.

Figure 5:
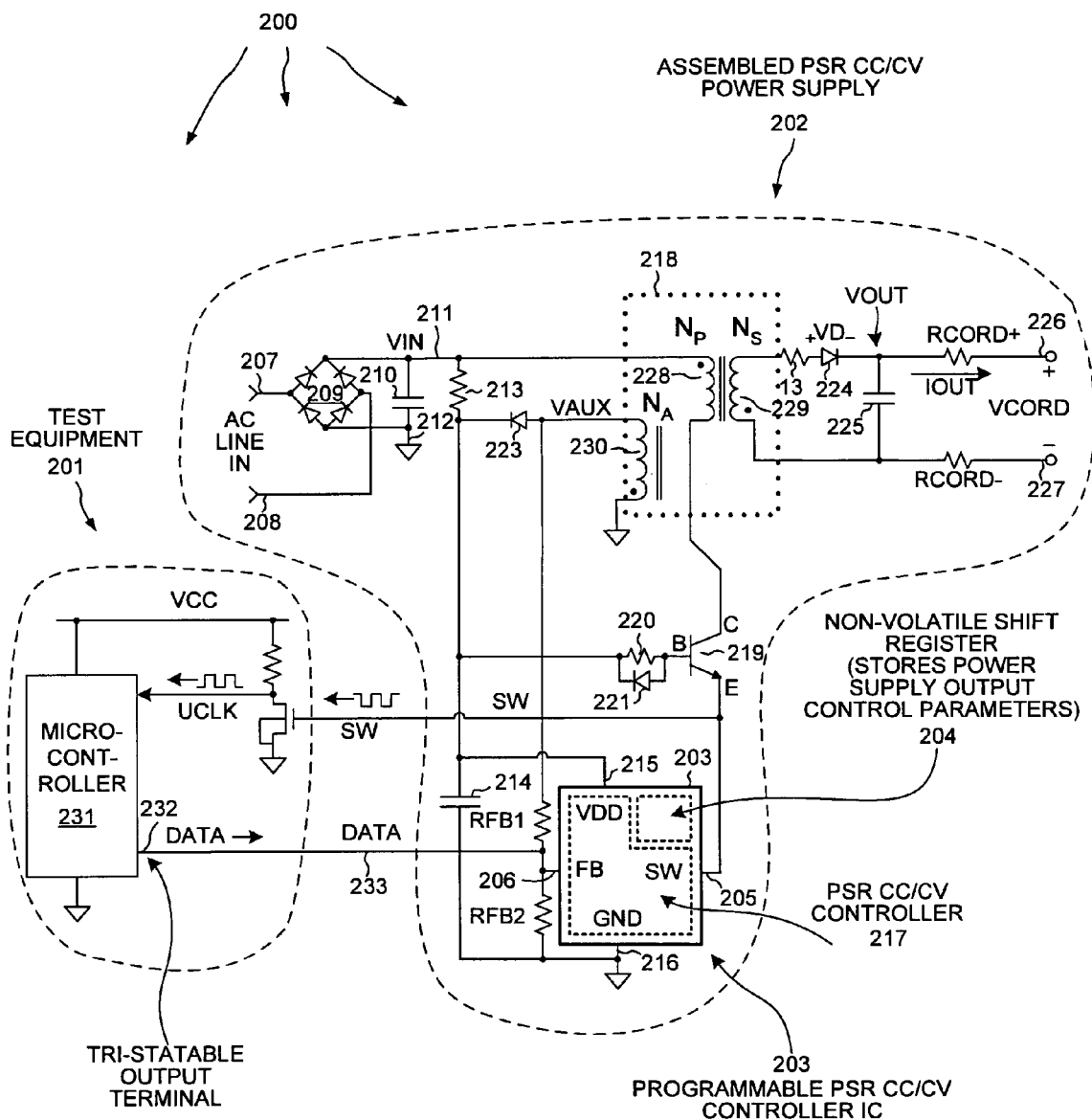
FIG. 5 is a diagram of a system 200 in accordance with one novel aspect.

FIG. 5 is a diagram of a system 200 in accordance with one novel aspect. System 200 involves automatic test equipment (ATE) 201 and a power supply 202. Power supply 202 is an assembled and operating primary-side regulation constant current/constant voltage (PSR CC/CV) flyback battery charger. In the illustrated example, power supply 202 is a populated printed circuit board of the power supply that is not yet covered with its plastic enclosure. The various nodes of the printed circuit board are accessible for probing and testing.

Rather than just testing and/or programming a PSR controller integrated circuit at "final test" of the integrated circuit as described in the background section of this patent document, novel PSR CC/CV controller integrated circuit 203 is a part of assembled power supply 202. While power supply 202 operates, ATE 201 exercises the power supply and collects information on how the power supply performs under different operating conditions. ATE 201 then uses the collected information to determine what programming information (DATA) to load into a rewritable non-volatile shift register 204 portion of integrated circuit 203. To load the programming information, ATE puts integrated circuit 203 into a program mode by some mechanism. In the present example, ATE 201 drives an unusually high voltage onto the FB feedback terminal 206 of integrated circuit 203. Because this high voltage is not a voltage that would ordinarily be on FB terminal 206 during normal power supply operation (not during program mode operation), PSR CC/CV controller circuitry 217 of integrated circuit 203 detects the unusually high voltage and in response enters the program mode. ATE 201 then serially supplies bits of the determined programming information (DATA) onto feedback terminal FB 206 synchronously with the switching signal SW of integrated circuit 203 on SW terminal 205. The programming information is shifted into non-volatile shift register 204.

In one embodiment, PSR CC/CV controller integrated circuit 203 includes a programming information readback capability usable to verify that proper programming information was loaded into integrated circuit 203. Microcontroller terminal 232 is a bi-directional input/output terminal, and FB terminal 206 is also a bi-directional input/output terminal. Control logic of integrated circuit 203 includes logic that looks at the first bit received from ATE 201 and if the bit is a zero, then integrated circuit 203 remains in a write sub-mode of the program mode (integrated circuit 203 is written to in the program mode), whereas if the bit is a one, then integrated circuit 203 enters a read sub-mode of the program mode (information from integrated circuit 203 is read by ATE 201) and shifts programming information out FB terminal 206 and onto conductor 233. ATE 201 reads the information from conductor 233, and confirms that proper programming information was shifted into non-volatile shift register 204 during the write sub-mode.

Once the proper programming information is in non-volatile shift register 204, the programming information sets and adjusts various electrical output characteristics of power supply 202. In one example, the programming information (DATA) sets a desired regulation voltage at which integrated circuit 203 regulates the output voltage VOUT during constant voltage (CV) mode operation, and also sets a desired regulation current at which integrated circuit 203 regulates the output current IOUT during constant current (CC) mode operation. ATE 201 performs such testing and programming on unit after unit of assembled power supplies. By testing and programming at this "in-circuit" stage of manufacture of the power supplies, current/voltage points of operation outside of specified bounds due to variations in components of the power supply such as the transformer and the power cord can be compensated for such that all units after programming will operate within the specified bounds. The structure and operation of system 200 is described in further detail below.

Operation in Normal Mode:

Assembled PSR CC/CV power supply 202 includes two AC input terminals 207 and 208, a full wave bridge rectifier 209, and a smoothing capacitor 210. An alternating current 110-240 volt (AC) line voltage on input terminals 207 and 208 is rectified by rectifier 209 and capacitor 210 so that a rectified and smoothed rough DC voltage is present between first and second input nodes 211 and 212. The voltage on first input node 211 is also referred to as the "input line voltage" or "line input voltage" (VIN). VIN is used to power programmable PSR CC/CV controller integrated circuit 203. Power is received using a network involving resistor 213 and capacitor 214 such that a voltage referred to here as VDD is supplied onto a VCC terminal 215 of integrated circuit 203. Ground potential on input node 212 is supplied onto a ground terminal 216 of integrated circuit 203.

Assembled PSR CC/CV power supply 202 also includes a transformer 218, a switch 219, components 220 and 221, two diodes 223 and 224, an output capacitor 225, and a power cord that terminates in two terminals 226 and 227. The RCORD+ and RCORD− labels represent resistance of the power cord. Such resistances may, for example, be approximately 0.25 ohms. Transformer 218 includes a primary winding 228, a secondary winding 229, and an auxiliary winding 230.

Figure 6:
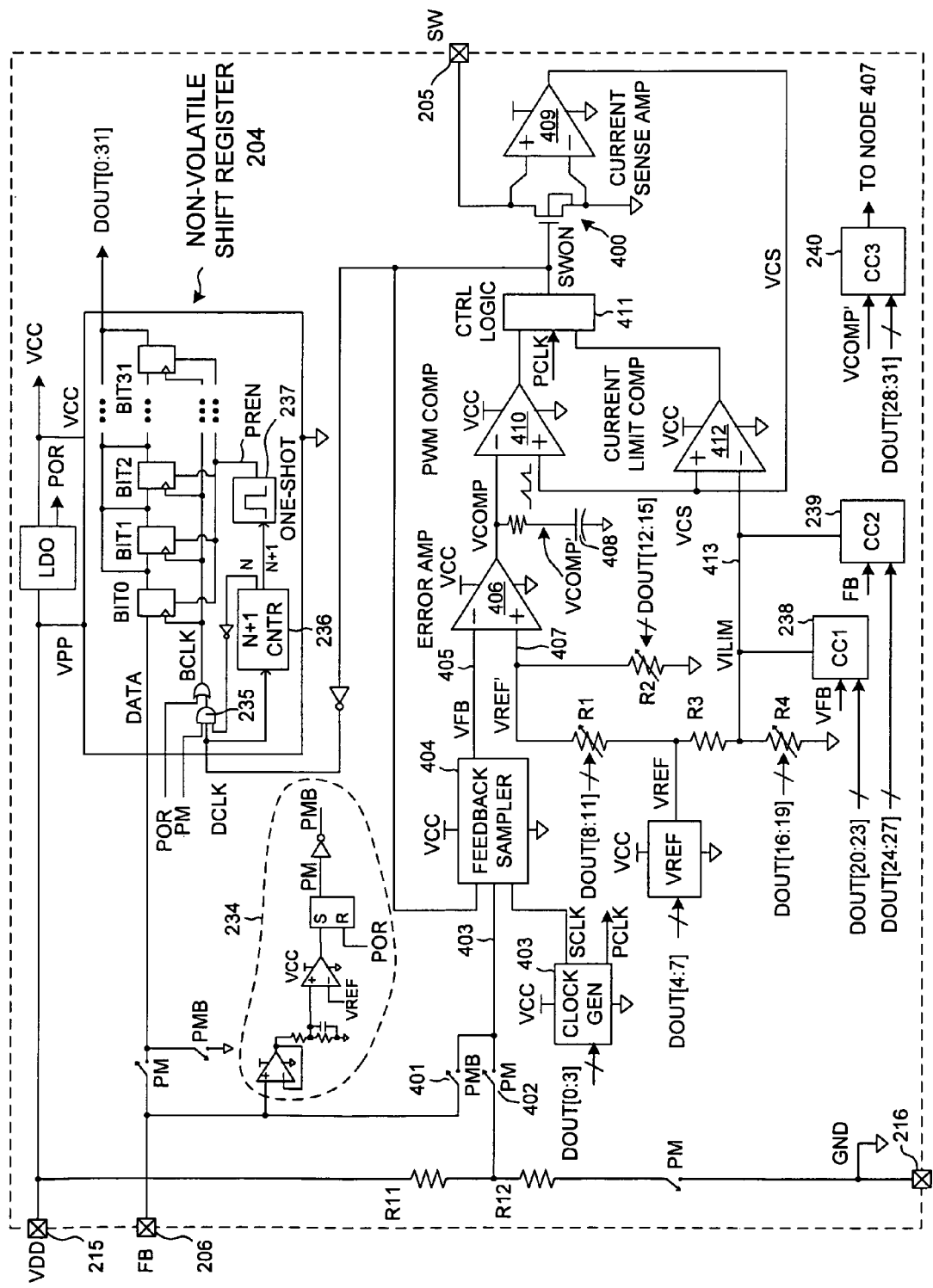
FIG. 6 is a more detailed circuit diagram of the PSR CC/CV controller integrated circuit 203 of FIG. 5.

FIG. 6 is a more detailed circuit diagram of PSR CC/CV controller integrated circuit 203 of FIG. 5. Integrated circuit 203 includes the non-volatile shift register 204. The remainder of the circuitry illustrated in FIG. 6 is the PSR CC/CV controller 217 of FIG. 5. Integrated circuit 203 has four and only four terminals: FB terminal 206, SW terminal 205, VDD terminal 215 and ground terminal 216.

FIG. 7 is a table that sets forth the functions controlled by the various bits DOUT [0:31] of programming information stored in non-volatile shift register 204.

FIG. 8 is a diagram that illustrates one way that the programmable resistors R1, R2 and R4 of FIG. 6 can be realized. An incoming four-bit digital value on input leads 300 is decoded by 4:16 decoder 301 to generate control signals C1-C16. Each one of control signals C1-C16 controls a corresponding respective one of the various illustrated switches to short out or switch in the associated resistors RS1-RS16 between node 302 and 303. Resistor RS17 is always coupled into the current path between nodes 302 and 303.

When operating in the constant voltage (CV) mode and in the normal mode (not the program mode), integrated circuit 203 causes an N-channel transistor 400 (see FIG. 6) to be conductive. This allows current to begin to flow from line input node 211 (see FIG. 5), through primary winding 228, through switch 219, into SW terminal 205 of integrated circuit 203, through N-channel transistor 400, to ground terminal 216 of integrated circuit 203, and to ground node 212.

Figure 9:
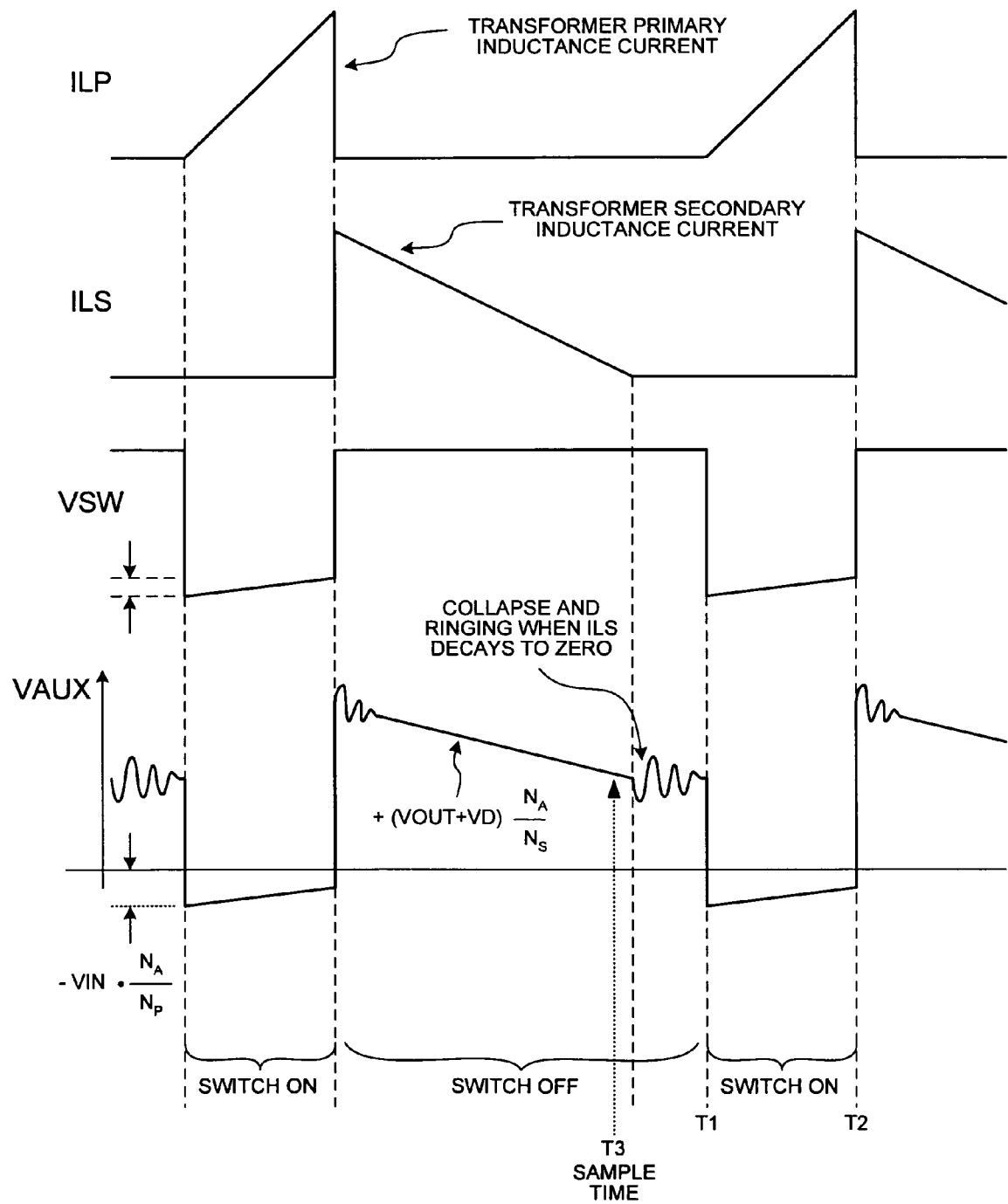
FIG. 9 is a waveform diagram of signals in power supply 202 of FIG. 5.

FIG. 9 is a waveform diagram of signals in power supply 202. The waveform labeled ILP represents the current flowing through primary winding 228. In response to a rising edge of PCLK, control logic 411 (see FIG. 6) asserts the switch-on signal SWON high, thereby turning on N-channel transistor 400 at time T1. The primary current ILP ramps up as illustrated in FIG. 9.

The output voltage VOUT of the power supply is related to the voltage VAUX on auxiliary winding 230 during the off-time of switch 400. The waveform VAUX is illustrated in FIG. 9. Integrated circuit 203 regulates output voltage VOUT by using the VAUX voltage detected through a voltage divider of external resistors RFB1 and RFB2. The divided down VAUX voltage on the tap of the voltage divider is detected on FB terminal 206. When the power supply is in normal mode (not in program mode), signal PMB is high and signal PM is low. Switch 401 of FIG. 6 is therefore closed and switch 402 is open. The voltage on FB terminal 206 is therefore supplied through switch 401 and onto node 403. Feedback sampler 404 samples the voltage on node 403 each switching cycle at time T3 (see FIG. 9) during the off-time of N-channel transistor 400 and supplies the sampled voltage VFB onto node 405. Transconductance error amplifier 406 generates an error signal based on a voltage difference between the voltage VFB on node 405 and a reference voltage VREF' on node 407. Due to capacitor 408, error amplifier 406 functions as an integrator such that over time the relatively slowly varying voltage VCOMP decreases as the voltage VFB increases with respect to VREF' from cycle to cycle. Current sense amplifier 409 senses the voltage drop across the on-resistance of N-channel transistor 400 during the on-time of transistor 400. In FIG. 9, after time T1 when the primary current ILP begins to ramp up, the current sense signal VCS also begins to ramp up. When the voltage VCS increases to the point that it reaches VCOMP, comparator 410 (see FIG. 6) trips and supplies a rising edge to control logic 411. Control logic 411, in response to receiving either a rising edge from comparator 410 or from comparator 412, forces signal SWON low and turns off N-channel transistor 400. The turning off of N-channel transistor 400 is illustrated at time T2 in FIG. 9. The cutting off of current flow in primary winding 228 causes current to flow in secondary winding 229 as illustrated in waveform ILS in FIG. 9. The ILS current ramps down as illustrated until it reaches zero. This operation is referred to as "discontinuous mode" operation because there is an amount of time during the off-time of switch 219 when there is no current flow in the secondary winding 229. The switching cycle repeats on the next rising edge of the clock signal PCLK. The control loop operates to keep the N-channel transistor 400 conductive for a long enough amount of time that the voltage VFB on node 405 is regulated to be equal to the voltage VREF' on node 407. VREF' is adjusted so that VOUT is regulated to the desired voltage.

When operating in the constant current (CC) mode and in the normal mode (not the program mode), integrated circuit 203 also causes N-channel transistor 400 to be switched on and off. As in the case of the CV mode, the rising edge of PCLK causes control logic 411 to assert signal SWON high, thereby making N-channel transistor 400 conductive at the beginning of the switching cycle. Rather than N-channel transistor 400 being turned off due to a rising edge output from comparator 410, however, the N-channel transistor 400 is turned off due to a rising edge output from current limit comparator 412. During the on-time of N-channel transistor 400, the signal VCS ramps up along with the primary current waveform ILP illustrated in FIG. 9. Although voltage VCOMP is higher than the voltage VCS, the voltage VCS reaches the voltage VILIM on node 413. Current limit comparator 412 therefore trips and supplies a rising edge signal to control logic 411. Control logic 411 responds to this rising edge by forcing SWON low and turning N-channel transistor 400 off. Accordingly, rather than a rising edge from comparator 410 causing N-channel transistor 400 to turn off as in the CV mode, a rising edge from current limit comparator 412 causes N-channel transistor 400 to turn off in the CC mode. VILIM on node 413 is adjusted so that IOUT is regulated to the desired regulated current.

Figure 1:
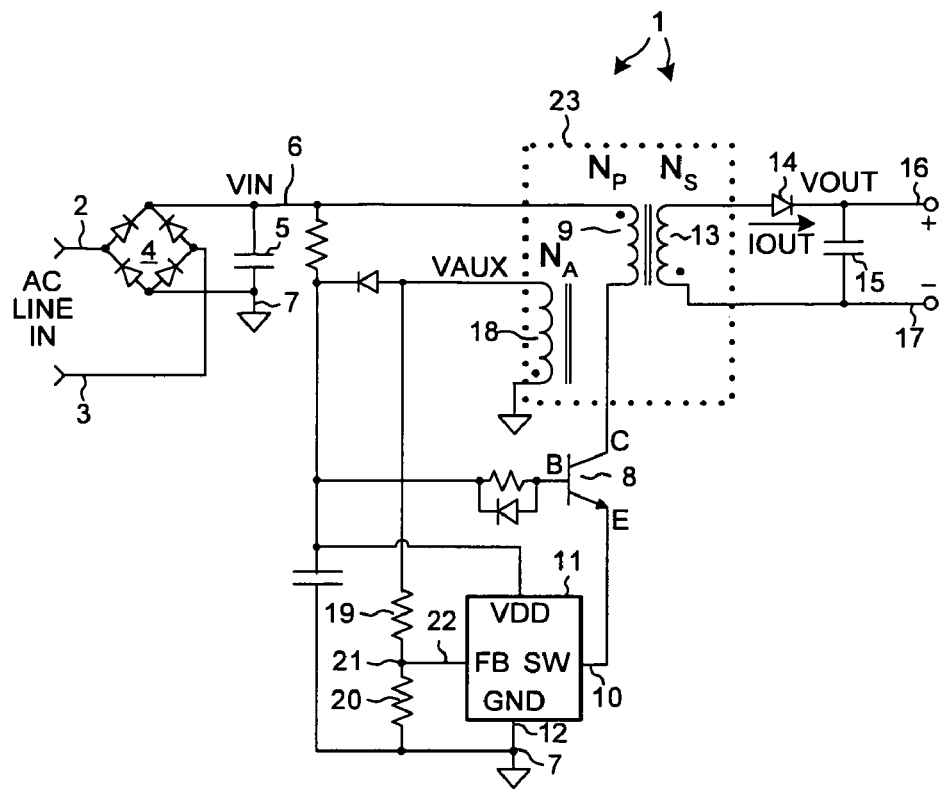
FIG. 1 (prior art) is a diagram of a conventional PSR CC/CV power supply.
Figure 10:
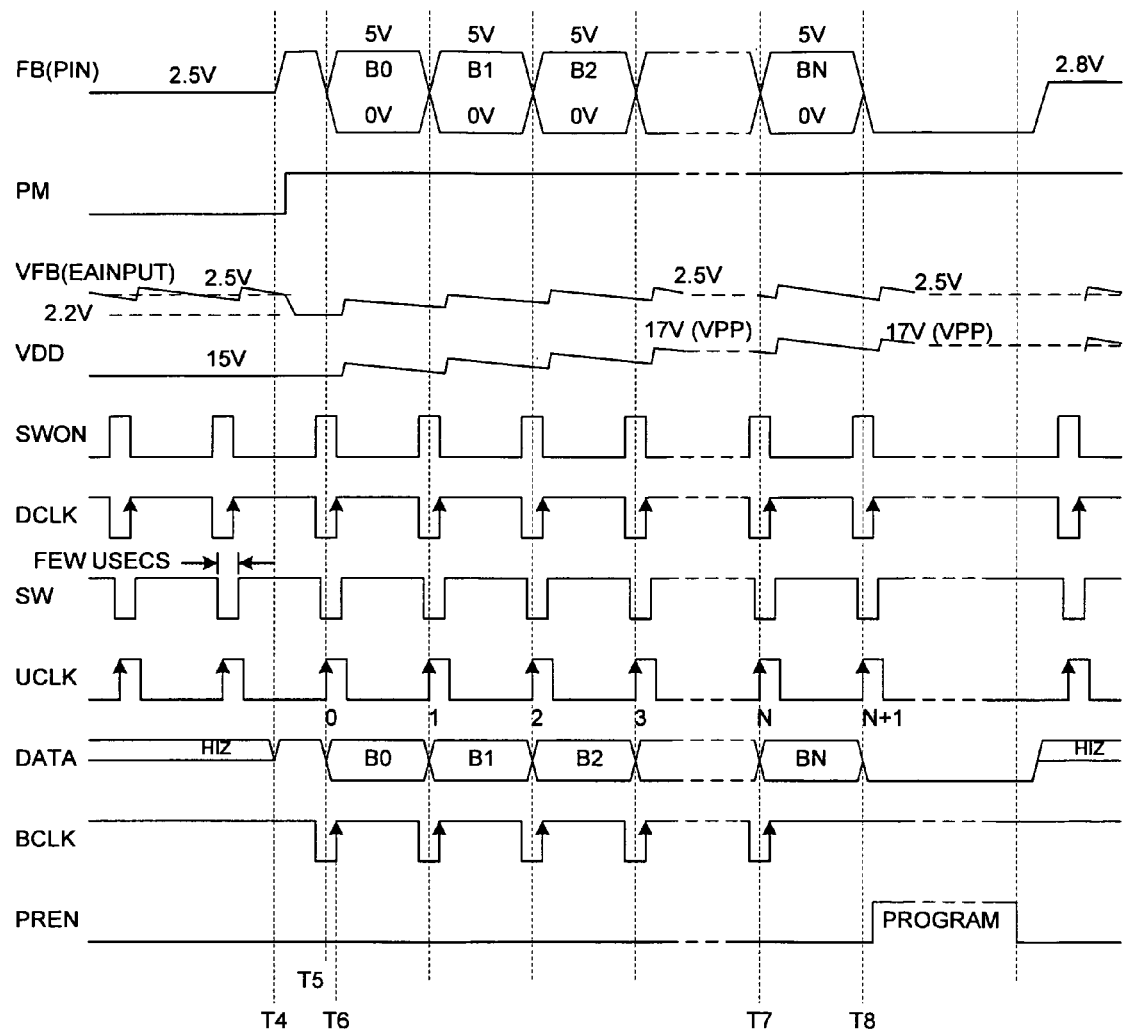
FIG. 10 is a waveform diagram that illustrates a novel method of putting PSR CC/CV controller integrated circuit 203 of FIG. 5 into the program mode, of serially shifting programming information into the non-volatile shift register, and then programming the programming information into the non-volatile shift register.

Operation in Program Mode:

FIG. 10 is a waveform diagram that illustrates a novel method of putting PSR CC/CV controller integrated circuit 203 into the program mode, of serially shifting programming information into the non-volatile shift register 204 of integrated circuit 203 while in the program mode, and then programming the programming information into the non-volatile shift register 204 while in the program mode. Initially, the assembled power supply 202 is operating in constant voltage mode and in normal mode, and is coupled to ATE 201 as illustrated in FIG. 1. In normal operation, the voltage on FB terminal 206 of integrated circuit 203 is approximately 2.5 volts. Microcontroller 231 is coupled to FB terminal 203 via output terminal 232 and conductor 233. Microcontroller 231 does not drive conductor 233, but rather maintains its terminal 232 in a high-impedance state so that the feedback voltage on terminal FB 206 is not affected by the microcontroller.

Then, at time T4, microcontroller 231 drives its terminal 232 to five volts, thereby driving conductor 233 and terminal FB 206 of integrated circuit 203 to five volts. This is illustrated in the upper waveform labeled FB(PIN) in FIG. 10. This condition is detected by program mode detection circuitry 234 in FIG. 6. Signal PM is asserted high, and signal PMB is asserted low. The assertion of signal PM high is represented by the low-to-high transition of the signal waveform PM in FIG. 10. When PM transitions high, switch 401 opens and decouples the terminal FB 206 from node 403, and switch 402 closes and couples node 403 to an on-chip resistor voltage divider involving resistors R11 and R12. Whereas the external resistors RFB1 and RFB2 of FIG. 5 are sized such that integrated circuit 203 operates in CV mode to regulate the output voltage VOUT to 5.0 volts and VAUX to a corresponding 15.0 volts, for example, the internal resistors R11 and R12 are sized such that integrated circuit 203 operates in CV mode to regulate the VOUT to a voltage higher than 5.0 volts. VAUX is therefore at a corresponding 17.0 volts. The VAUX of 17.0 volts is referred to as the programming voltage VPP. Note that in each successive switching cycle illustrated in FIG. 10, the VFB and VDD voltages increase until VDD (VDD is VAUX minus a diode voltage drop) reaches 17.0 volts.

Microcontroller 231, after driving FB terminal 206 to five volts and putting integrated circuit 203 into the program mode, uses the signal SW to time the driving of programming data across conductor 233 and onto FB terminal 206. ATE 201 receives the signal SW, and inverts it to form the signal UCLK that is then received by microcontroller 231. Microcontroller 231 detects this signal UCLK and drives the first bit of programming information onto conductor 233 in response to a low-to-high transition of UCLK (this corresponds to a high-to-low transition of SW). This occurs roughly at time T5 in the waveform diagram of FIG. 10.

Upon entering the program mode, the signal PM as supplied to the non-volatile shift register 204 in FIG. 6 is asserted high, thereby allowing DCLK (an inverted version of the switching signal SWON) to pass through AND gate 235 and to cause BCLK to begin clocking. In FIG. 10, note that the first BCLK pulse occurs after entering the program mode after time T4, and that this first pulse of BCLK has the same shape as the corresponding pulse of DCLK. The falling edge of BCLK corresponds to the rising edge of UCLK that microcontroller 231 used to begin driving the first bit of programming information onto conductor 233. The subsequent first rising edge of BCLK at time T6 causes this first bit of programming information (that was previously set up by microcontroller 231 onto terminal FB 206) to be clocked into BIT0 (MSB first, for example) of the non-volatile shift register 204. The system 200 uses the signal SW to synchronize the shifting of programming information from ATE 201 into integrated circuit 203.

This supplying of a bit of programming data onto FB terminal 206 by microcontroller 231 and the subsequent clocking of that bit into non-volatile shift register 204 occurs bit by bit until all thirty-two bits of shift register 204 have been loaded with corresponding bits of programming information. The shifting in of the last bit occurs on the rising edge of BCLK shortly after time T7 in the waveform diagram of FIG. 10. Counter 236 in the non-volatile shift register 204 counts the number of times DCLK transitions high, and on the next rising edge of DCLK shortly after time T8 counter 236 asserts a signal (designated "N+1" in FIG. 6) high. Assertion of this signal triggers a one-shot 237 such that one-shot 237 asserts a program enable signal PREN high. Assertion of signal PREN is illustrated after time T8 in the waveform diagram of FIG. 10. Assertion of PREN high causes the bits of programming information to be programmed into their respective bits of the non-volatile shift register 204. When one-shot 237 times out, PREN transitions low. In this example, operation continues in program mode until the input supply voltage to power supply 202 is removed or tuned off and the power supply 202 is unpowered. When power is thereafter applied to power supply 202 to verify operation after programming by ATE, or when power supply 202 is used by an end customer, the integrated circuit 203 starts up in normal mode (signal PM is low and remains low). The power supply 202 therefore does not operate in program mode unless it is forced to enter program mode by ATE 201.

Figure 11:
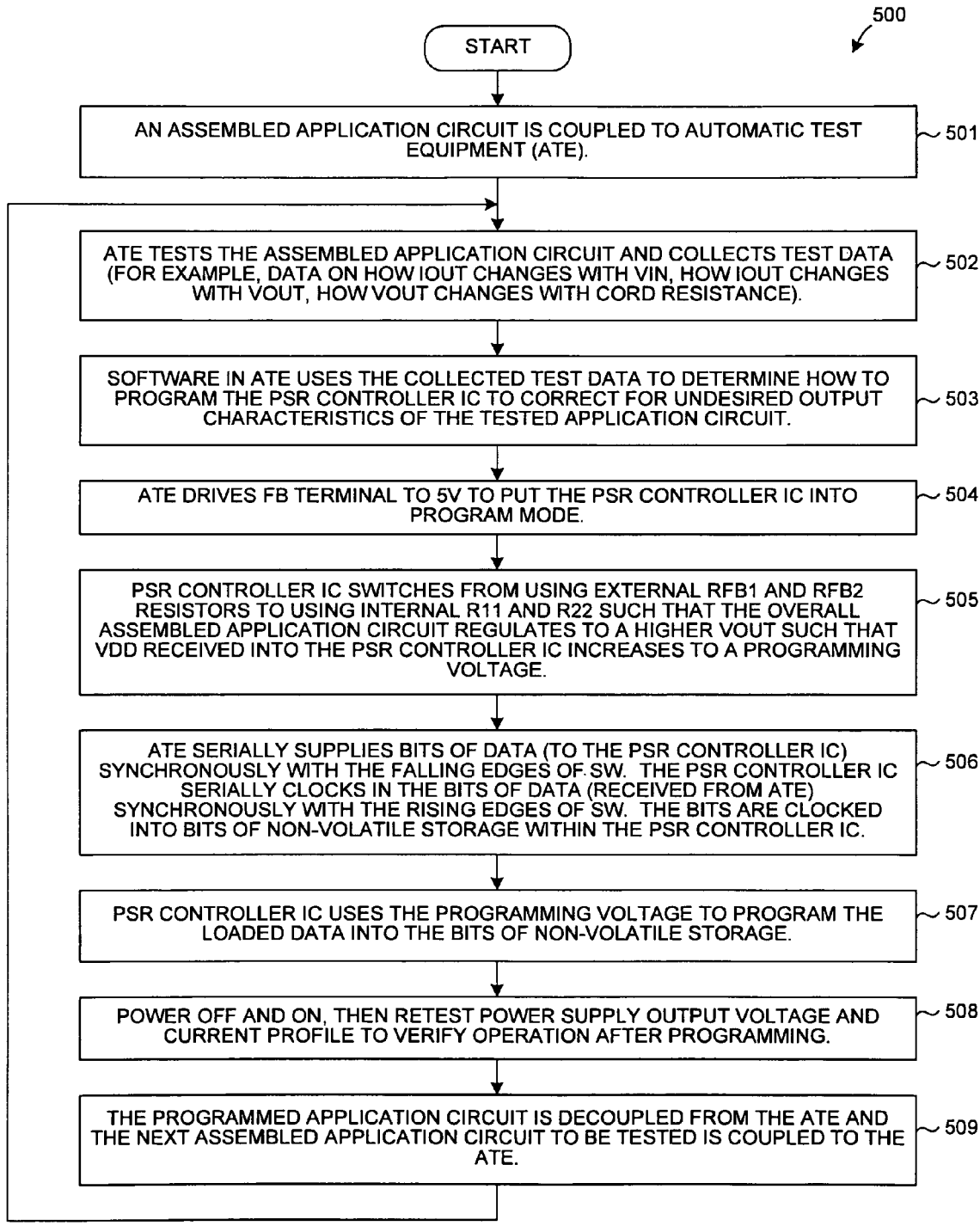
FIG. 11 is a flowchart of a novel method of programming a PSR CC/CV controller integrated circuit.

FIG. 11 is a flowchart of a method 500 of programming a PSR CC/CV controller integrated circuit in accordance with one novel aspect. In a first step (step 501), an assembled application circuit is coupled to automatic test equipment (ATE). In one example, the assembled application circuit is the PSR CC/CV power supply 202 of FIG. 5 and the ATE is ATE 201 of FIG. 5.

Next (step 502), the ATE exercises and tests the assembled application circuit and collects test data. In one example, the ATE collects data on how IOUT changes with VIN, on how IOUT changes with VOUT, and on how VOUT changes with cord resistance.

Next (step 503), software executing in the ATE uses the collected test data to determine how to program the PSR controller integrated circuit in the assembled application circuit in order to correct for undesired output characteristics of the tested application circuit. In one example, this software determines what the values of the thirty-two bits of programming information shifted into non-volatile shift register 204 should be to correct for detected errors in the voltage and current output by power supply 202.

Next (step 504), the ATE drives the FB terminal of the PSR controller integrated circuit to five volts such that the PSR controller integrated circuit begins operating in the program mode.

Next (step 505), the PSR controller switches from using an external voltage divider involving RFB1 and RFB2 to using an internal voltage divider involving resistors R11 and R12. The overall assembled application circuit then regulates VOUT to a higher voltage such that VDD received into the PSR controller integrated circuit increases or decreases to a programming voltage. In one example, VDD increases from approximately 15 volts to approximately 17 volts.

Next (step 506), the ATE serially supplies bits of programming information to the PSR controller integrated circuit synchronously with the signal SW, and the PSR controller shifts the bits into its non-volatile shift register synchronously with the signal SW. In one example, ATE 201 of FIG. 5 supplies bits of programming information onto the FB terminal 206 of integrated circuit 203 synchronously with falling edges of signal SW, and integrated circuit 203 clocks in the bits of programming information synchronously with rising edges of signal SW.

Next (step 507), the PSR controller integrated circuit uses the programming voltage (the raised 17 volt voltage VDD) to program the loaded programming information into the bits of the non-volatile shift register.

Next (step 508), the power supply is powered off and back on, and is retested to obtain the power supply's output voltage and output current profile to verify proper power supply operation after programming.

Next (step 509), the programmed application circuit is decoupled from the ATE and the next assembled application circuit to be tested is coupled to the ATE. Steps 501-509 are repeated automatically and rapidly under control of the ATE such that a sequence of many assembled application circuits (for example, CC/CV power supplies) is tested and programmed.

Figure 12:
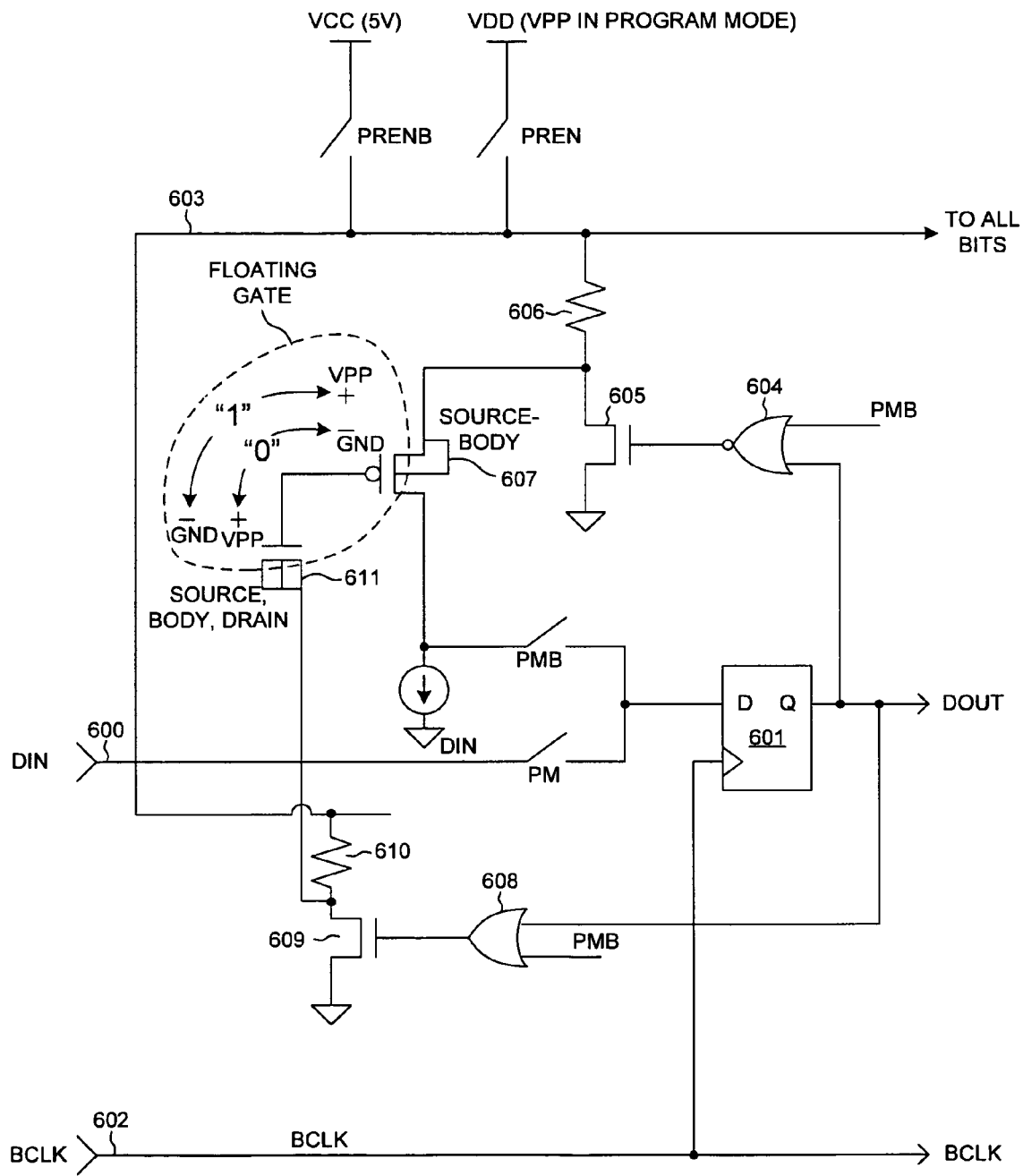
FIG. 12 is a simplified circuit diagram of one way to realize a bit of non-volatile shift register 204 of FIG. 5.

FIG. 12 is a simplified circuit diagram of one way to realize a bit of non-volatile shift register 204. Tunneling transistor 611 is an N-channel transistor having a body that is isolated from the integrated circuit substrate. The body is isolated so that body can be pulled up to the programming voltage.

To program a bit of programming information into the non-volatile cell of FIG. 12, a bit of programming information on DIN serial input 600 is shifted into D-type flip-flop 601 on the rising edge of BCLK. BCLK is received on clock input 602. Once the bit of programming information is present in flip-flop 601, the programming enable signal PREN is pulsed as illustrated in FIG. 10. The programming voltage is therefore supplied onto conductor 603. If the bit of information stored in flip-flop 601 is a digital logic high, then NOR gate 604, transistor 605 and resistor 606 cause the programming voltage to be supplied onto the source-body of P-channel transistor 607. Also, OR gate 608, transistor 609 and resistor 610 cause ground potential to be coupled onto the body-source-drain terminals of tunneling transistor 611. The floating gate of P-channel transistor 607 is then programmed such that transistor 607 is conductive and such that the non-volatile cell stores a digital logic high.

If, on the other hand, the bit of information stored in flip-flop 601 is a digital logic low, then NOR gate 604, transistor 605 and resistor 606 cause ground potential to be coupled onto the source-body of P-channel transistor 607. OR gate 608, transistor 609 and resistor 610 cause the programming voltage to be supplied onto the body of tunneling transistor 611. The floating gate of P-channel transistor 607 is then programmed such that transistor 607 is nonconductive and such that the non-volatile cell stores a digital logic low. The programmed values of each non-volatile bit are latched into flip-flop 601 at power-up of the PSR CC/CV controller integrated circuit when POR transitions from low to high.

Figure 13:
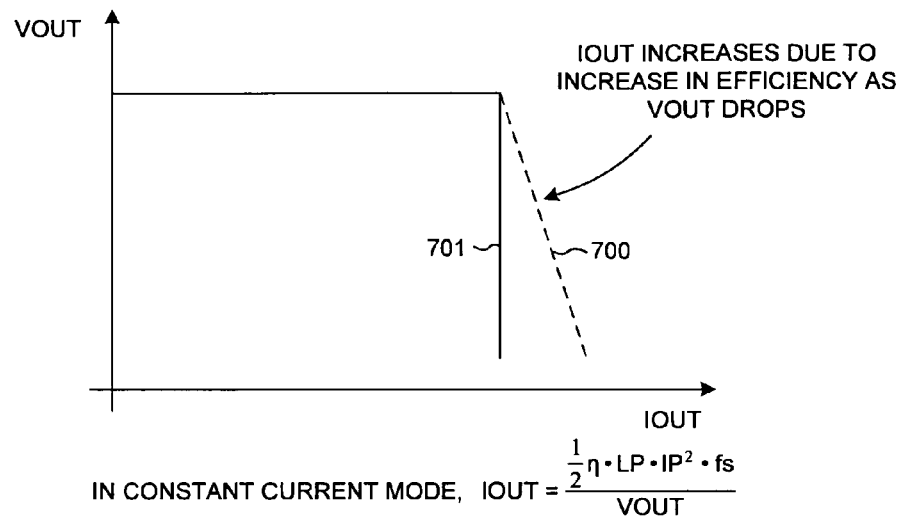
FIG. 13 is a diagram that shows how IOUT increases with decreasing VOUT due to an increase in efficiency in an actual assembled PSR CC/CV power supply.

Efficiency Variation Compensation:

FIG. 13 is a diagram that represents operation of an actual assembled PSR CC/CV power supply. As VOUT decreases, IOUT is seen to increase. The output voltage and output current points of operation do not follow the ideal vertical line 700, but rather follow the dashed line 701. This is because as VOUT decreases, efficiency of the power supply increases. In constant current mode, the PSR CC/CV controller integrated circuit makes the switching frequency fs proportional to VOUT. Therefore, as VOUT decreases, fs decreases. There are, however, switching losses associated with switching the power supply, so reducing the switch frequency fs reduces the amount of switching and causes a reduction in switching losses, thereby increasing efficiency. As indication by Equation 1 below, a change in efficiency η causes proportional a change in IOUT in an ordinary uncorrected PSR power supply.

$$IOUT = \frac{\frac{1}{2} \cdot \eta \cdot Lp \cdot IP^2 \cdot fs}{VOUT} \quad \text{(Equ. 1)}$$

where Lp is the primary winding inductance and IP is the peak current in the primary winding in each switching cycle.

Figure 14:
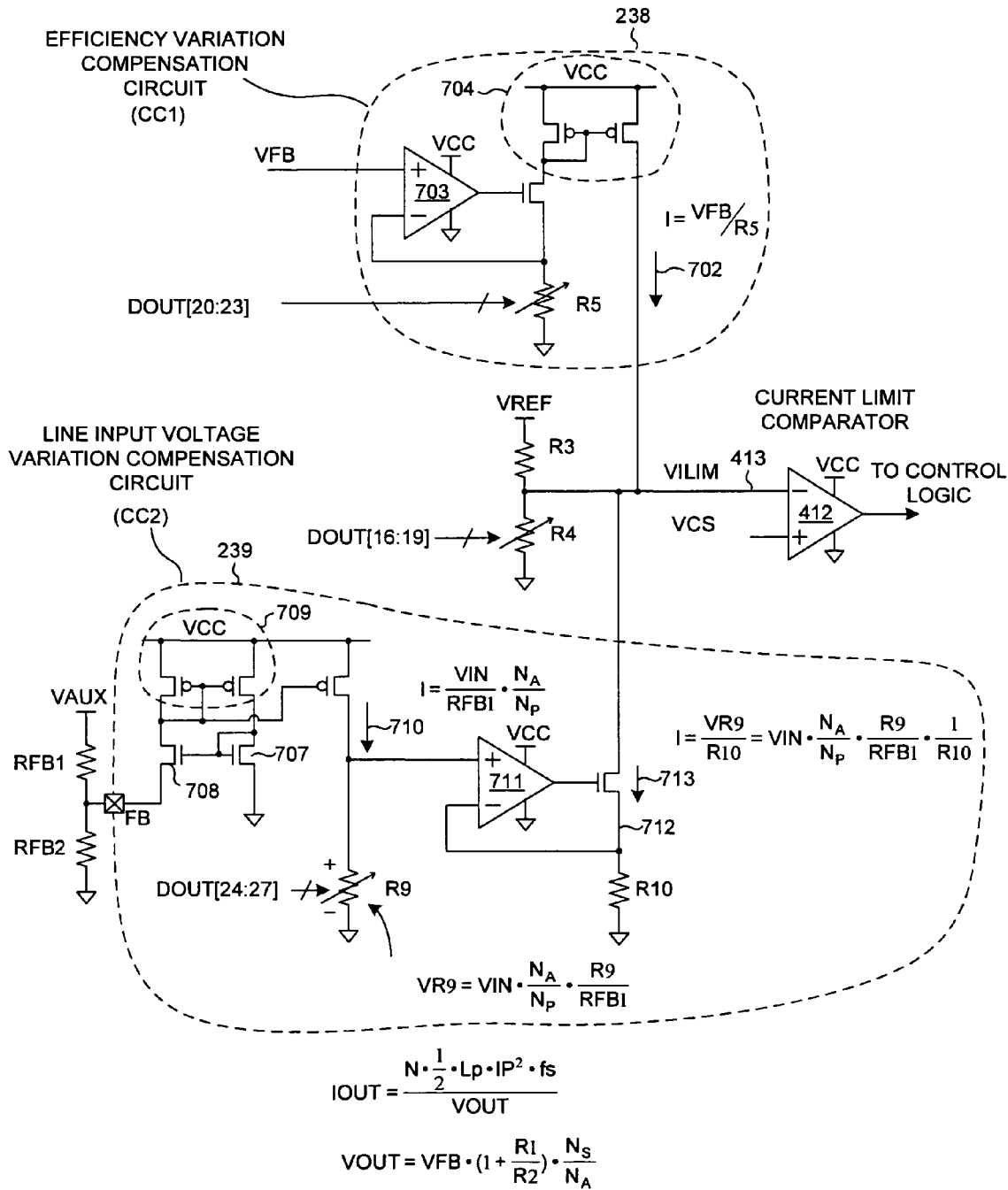
FIG. 14 is a circuit diagram of the efficiency variation compensation circuit 238 (CC1) and of the line input voltage variation compensation circuit 239 (CC2) of FIG. 6.

FIG. 14 illustrates the efficiency variation compensation circuit 238 (CC1) of FIG. 6. The voltage VILM on node 413 sets the peak current limit value ILIM which determines IOUT in constant current mode. Decreasing VILM therefore decreases IOUT. Increasing VILM therefore increases IOUT. The magnitude of VILM is set in part by the resistances of resistors R3 and R4, and by the reference voltage VREF. The novel efficiency variation compensation circuit 238 works by generating a current 702 that decreases in proportion to a decrease in VOUT. This current 702 is supplied onto node 413. Therefore if VOUT decreases, the total current flowing into node 413 decreases, and the voltage VILM deceases, thereby decreasing ILIM and IOUT from what it would otherwise be. This reduction in IOUT compensates for and corrects for what would otherwise be an increase in IOUT as VOUT decreases. Amplifier 703 operates to force the voltage across programmable resistor R5 to be VFB. The current flowing across R5 is therefore VFB/R5. This current is mirrored by current mirror 704 to generate the current 702 that is made to flow into node 413. Accordingly, programming the resistance of programmable resistor R5 allows the amount of efficiency compensation to be adjusted.

Primary Inductance Variation Compensation:

In accordance with Equation 1 above, IOUT varies with variations in primary winding inductance. Such variations in primary winding inductance, from manufacturer transformer unit to manufactured transformer unit, arise from variations in the transformer manufacturing process. Variations in IOUT, which are due to variations in Lp, can be corrected by trimming R4. For example, if Lp varies by +7%, then R4 can be adjusted down by 2.64% (the square root of seven percent), to bring IOUT back down to the desired nominal value. Programmable resistor R4 adjusts VILIM, which sets the peak current, IP, in the primary winding.

VIN Line Voltage Variation Compensation:

In constant current (CC) mode, current limit comparator 412 detects when the primary current exceeds the current limit ILIM when switch 400 is on. When the current sense voltage VCS exceeds the current limit voltage VILIM on node 413, comparator 412 trips and outputs a low-to-high transition that in turn causes control logic 411 to force switch signal SWON low, thereby causing N-channel transistor 400 to be turned off and causing switch 219 to be turned off. There is, however, a delay in time between the time VCS exceeds VILIM and the time when switch 219 is actually turned off and current stops flowing in primary winding 228. It is assumed that this turn-off propagation is approximately fixed, regardless of the magnitude of the input line voltage VIN. In an ordinary PSR CC/CV power supply, the rate of current ramping up in the primary winding depends on the magnitude of the input line voltage VIN. The rate is roughly given by Equation 2 below.

$$\frac{dI}{dT} = \frac{VIN}{LP} \quad \text{(Equ. 2)}$$

Figure 15:
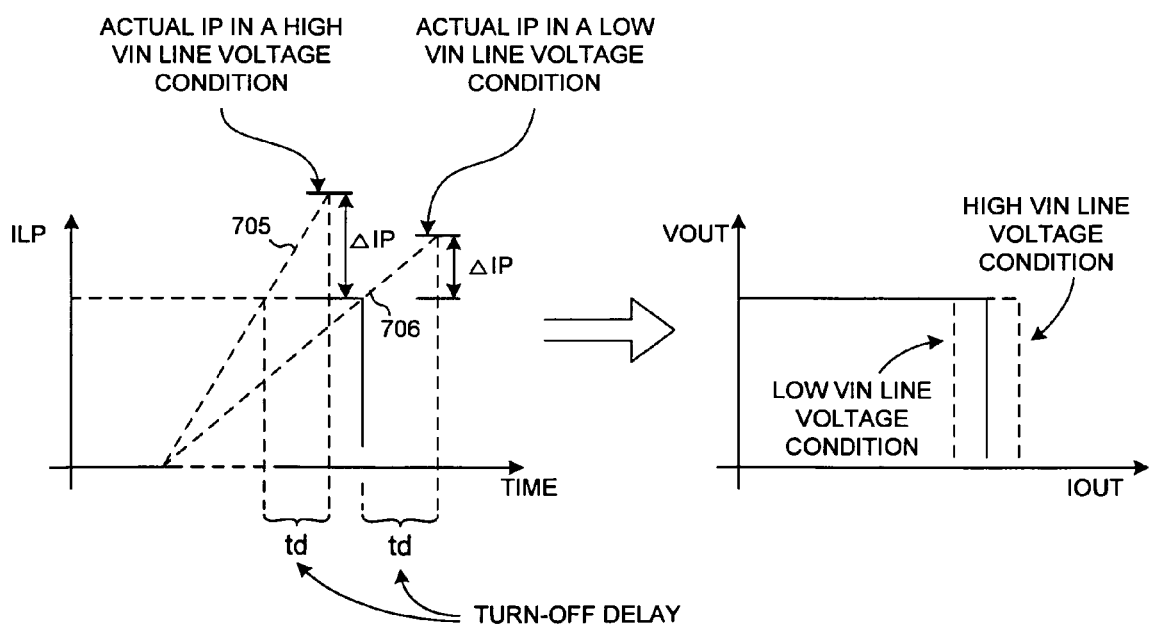
FIG. 15 shows the ramp up in primary current ILP in two conditions, where the two conditions lead to two different peak current values.

FIG. 15 shows the ramp up in primary current ILP when switch 219 is on in two conditions. In one condition (represented by dashed line 705) the input line voltage VIN is relatively high, for example 240 VAC, whereas in the other condition (represented by line 706) VIN is relatively low, for example 100 VAC. As indicated in FIG. 15, if the slope of current ramp up in the primary is steeper, then the primary inductor current ILP will continue to rise a greater amount during the approximately fixed turn-off time (between the time VCS crosses the current limit voltage VILIM and the time when the switch 219 actually turns off and current stops flowing in primary winding 228). If the slope of current ramp up in the primary inductor is less steep, then the primary inductor current ILP will continue to rise a smaller amount during the approximately fixed turn-off time (between the time VCS crosses the current limit voltage VILIM and the time when the switch 219 actually turns off and current stops flowing in the primary winding 228). The peak current IP of the power supply therefore varies and this causes the regulated output current IOUT to vary as well. IOUT is seen to vary with the input line voltage VIN.

In one novel aspect, input voltage variation correction circuit 239 (CC2) of FIGS. 6 and 14 operates to compensate for and correct for this undesirable variation in peak current IP. A current is pulled from node 413 so that VILIM is less than it otherwise would be, and this current is made to increases proportionally with increasing VIN so that the effect illustrated in FIG. 15 is corrected. As indicated in FIG. 9, when switch 219 is conductive the voltage on the auxiliary winding VAUX is negative. VAUX is approximately $(-VIN*(N_A/N_P))$. This negative VAUX is voltage—divided by the resistor voltage divider of resistors RFB1 and RFB2 such that a negative voltage, is present on FB terminal 206 during the on-time of switch 219. N-channel transistor 707 is diode-connected and has its source grounded. This causes the source of the other N-channel transistor 708 to be roughly at ground potential as well. The negative voltage on FB terminal 206 causes a current to flow out of transistor 708 that is roughly equal to $-VIN*(N_A/N_P)/RFB1$. This current is proportional to input line voltage VIN. This current is mirrored by the P-channel current mirror 709. The resulting mirrored current 710 flows across programmable resistor R9 to generate a voltage VR9 that varies proportionally with input line voltage VIN. Amplifier 711 operates to force the voltage on node 712 to the voltage on its non-inverting input lead. The current 713 flowing through resistor R10 is therefore proportional to the input line voltage VIN. This current 713 is pulled from node 413 such that it serves to decrease the voltage VILIM on node 413 as VIN increases. Accordingly, if input line voltage VIN increases then the current 713 increases and the VILIM voltage is pulled down more to combat the affect illustrated in FIG. 15. Conversely, if the input line voltage VIN decreases then the current 713 decreases and the VILIM voltage is pulled-down less.

Figure 2:
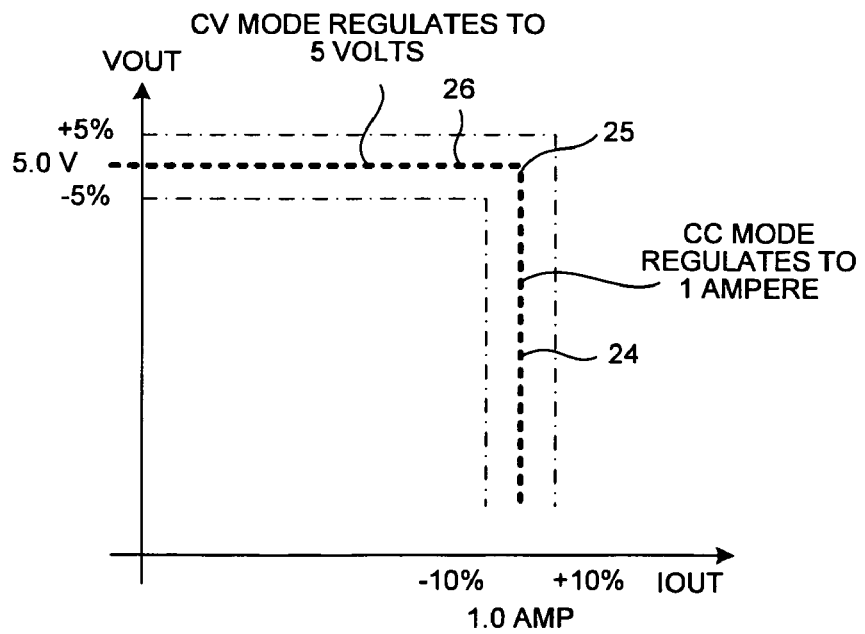
FIG. 2 (prior art) is an idealized graph of output voltage VOUT versus output current IOUT for a PSR CC/CV power supply.
Figure 3:
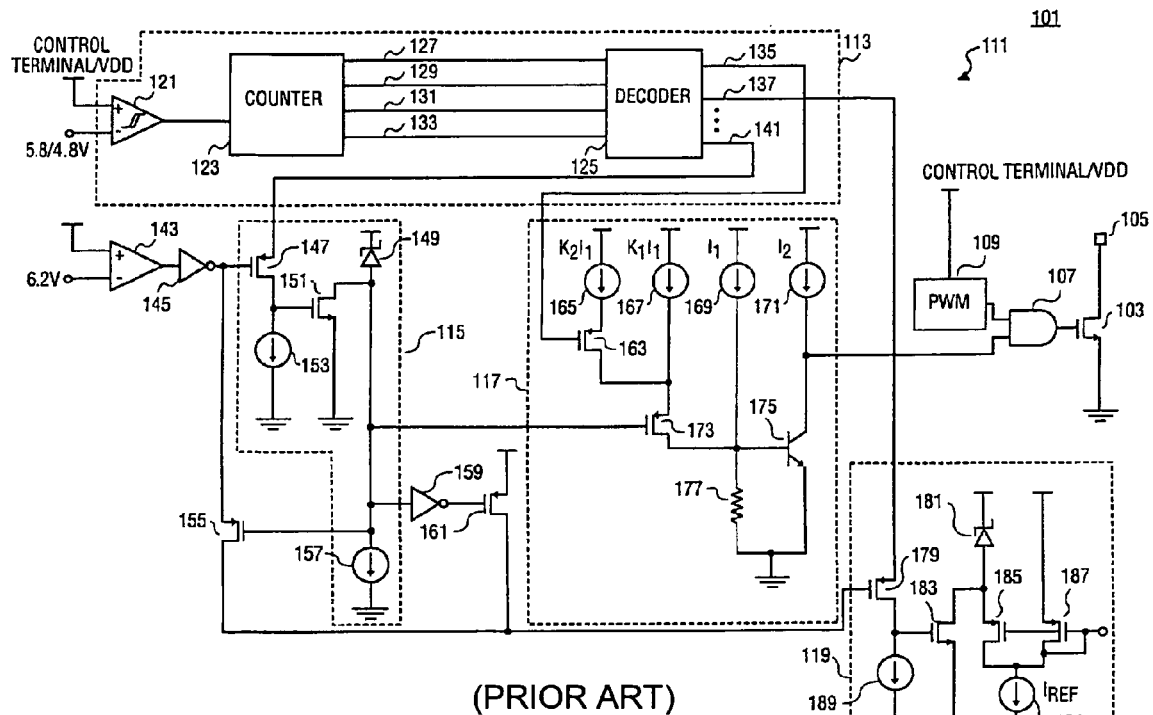
FIG. 3 (prior art) is a replication of FIG. 1 from U.S. Pat. No. 6,750,640.
Figure 4:
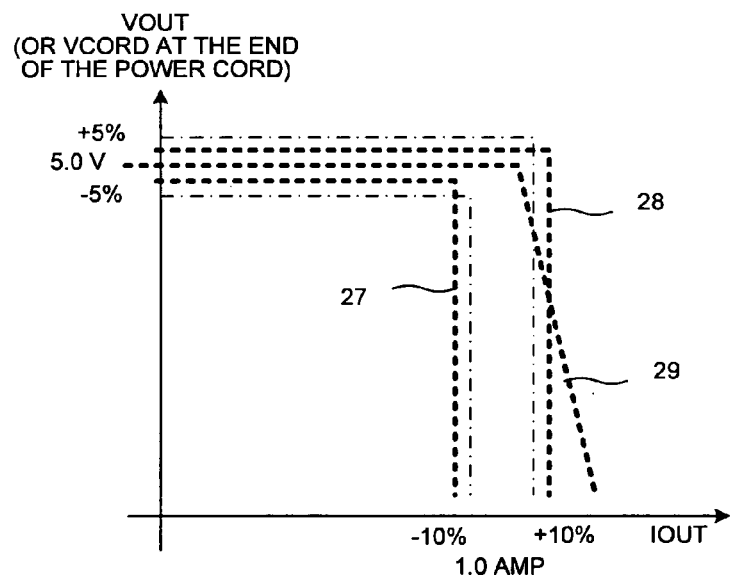
FIG. 4 (prior art) is a graph of output voltage VOUT versus output current IOUT for an assembled PSR CC/CV power supply.

VOUT Cord Resistance Compensation:

When a conventional PSR CC/CV power supply is in use, it is coupled via a cord to the rechargeable battery of the device being charged. The resistance of the cord may be significant. Moreover, different units of the power supply may be intended to charge different types of devices, so the different units of the power supply may have different types of cords that have different resistances. Despite these differences in cord resistance, all units of the power supply are to operate within the constant current (CC) and constant voltage (CV) specifications illustrated in FIGS. 2 and 4. The bigger the resistance of the cord, the smaller VCORD at the end of the cord will be if the power supply is outputting current. Moreover, if the current output by the power supply increases, the voltage VCORD at the end of the cord decreases. This is undesirable. If IOUT increases, it is desired that VOUT be made to increase so that VCORD at the end of the cord remains constant, despite changes in IOUT, when the PSR CC/CV power supply operates in constant voltage (CV) mode.

Figure 16:
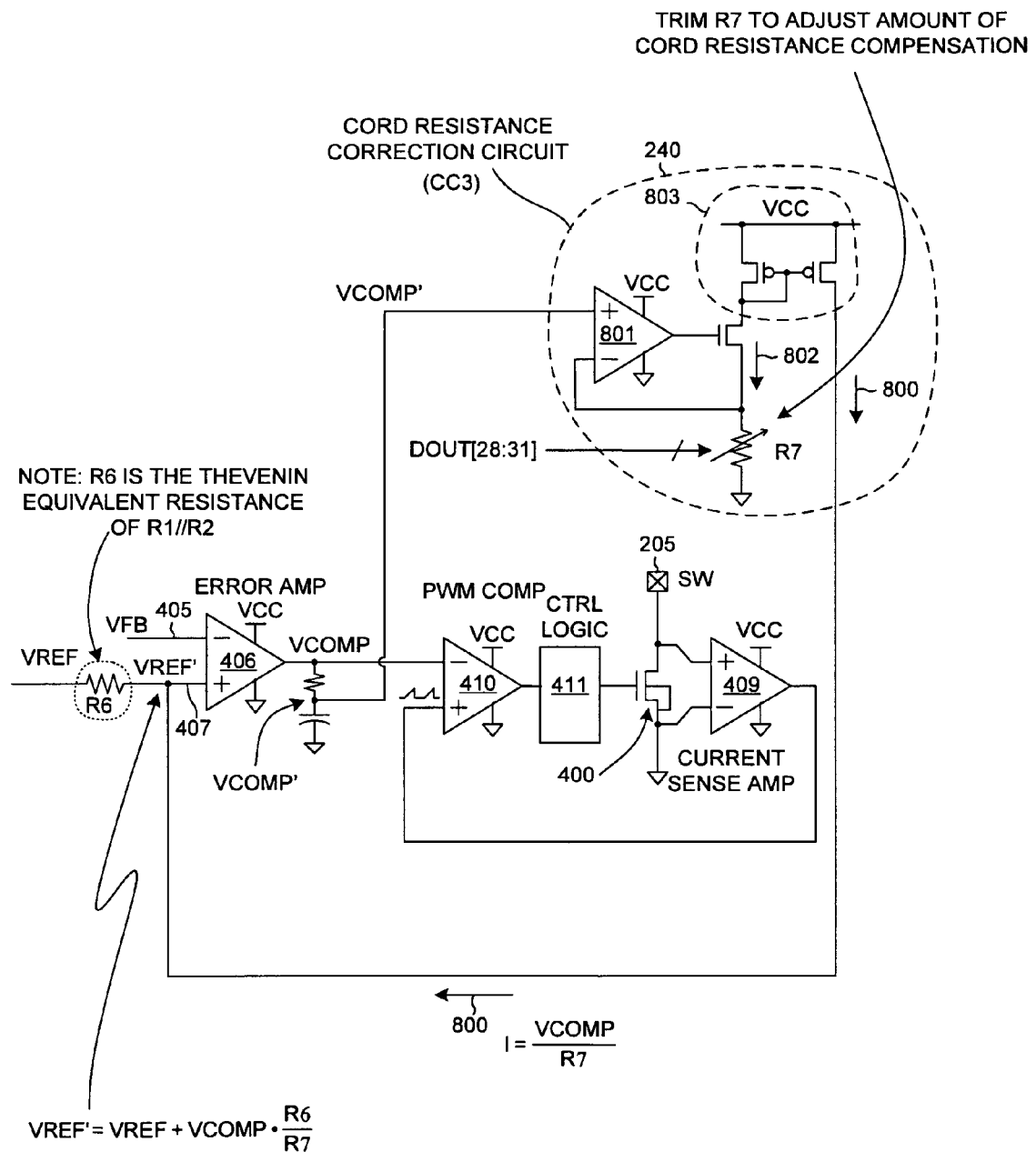
FIG. 16 is a circuit diagram of the cord resistance compensation circuit 240 (CC3) of FIG. 6.

The novel cord resistance compensation circuit (CC3) 240 of FIGS. 6 and 16 compensates for changes in VCORD due to changes in IOUT. It is recognized that in a current-mode PWM controller in CV mode, VCOMP is proportional to IOUT when the controller is in regulation. As IOUT increases, VCOMP increases. Cord resistance compensation circuit (CC3) 240 compensates for the increasing IOUT by supplying a current 800 onto node 407 that raises the voltage VREF' such that VOUT increases as IOUT increases. Amplifier 801 converts VCOMP' into a proportional current 802, which is equal to VCOMP'/R7. Current 802 is mirrored by the P-channel mirror 803 to output a current 800. Current 800 is supplied onto node 407. Resistance of programmable resistor R7 determines the amount of cord resistance compensation for what would otherwise be a decrease in VCORD as IOUT decreases.

Although certain specific embodiments are described above for instructional purposes, the teachings of this patent document have general applicability and are not limited to the specific embodiments described above. Conductor 233 can be used to communicate other types of information both from ATE 201 to integrated circuit 203, and from integrated circuit 203 to ATE 201. Error information, diagnostic information, control information, and error detection codes can be communicated across conductor 233. In one advantageous aspect, this information is communicated synchronously with respect to the signal SW when power supply 202 is operating. Such information can be communicated during normal operation of power supply 202 when the power supply is not coupled to ATE equipment, as well as during testing of power supply 202 such as the in-circuit testing described above. Accordingly, various modifications, adaptations, and combinations of various features of the described embodiments can be practiced without departing from the scope of the invention as set forth in the claims.

What is claimed is:

1. An integrated circuit comprising:
    a primary-side regulation constant current/constant voltage (PSR CC/CV) controller that regulates an output voltage (VOUT) of switching power supply in a constant voltage (CV) mode such that the output voltage is regulated to a regulated voltage value, and that regulates an output current (IOUT) of the switching power supply in a constant current (CC) mode such that the output current is regulated to a regulated current value; and
    a non-volatile shift register that stores a first value, wherein the first value is a factor in determining the regulated voltage value.

2. The integrated circuit of claim 1, wherein the integrated circuit has four and only four terminals.

3. The integrated circuit of claim 1, wherein the non-volatile shift register stores a second value, and wherein the second value is a factor in determining the regulated current value.

4. The integrated circuit of claim 3, wherein the integrated circuit includes a primary inductance variation compensation circuit, and wherein the second value sets the primary inductance variation compensation circuit.

5. The integrated circuit of claim 1, wherein the non-volatile shift register comprises a plurality of non-volatile storage bits, wherein the first value can be serially shifted into the integrated circuit and into the non-volatile shift register.

6. The integrated circuit of claim 1, wherein the PSR CC/CV controller is operable in a normal mode and in a program mode, wherein in the normal mode the PSR CC/CV controller regulates the output voltage in the constant voltage mode such that the output voltage is regulated to the regulated voltage value, whereas in the program mode the PSR CC/CV controller regulates the output voltage in the constant voltage mode such that the output voltage is regulated to a voltage different than the regulated voltage value.

7. The integrated circuit of claim 6, wherein the PSR CC/CV controller includes a line input voltage variation compensation circuit.

8. A primary-side regulation constant current/constant voltage (PSR CC/CV) controller integrated circuit that is operable in a constant voltage (CV) mode and in a constant current (CC) mode, wherein the PSR CC/CV controller stores a first value and a second value in a non-volatile shift register that is part of the PSR CC/CV controller integrated circuit, wherein the first value is a factor in determining a voltage at which the PSR CC/CV controller integrated circuit regulates a power supply output voltage in the CV mode, and wherein the second value is a factor in determining a current at which the PSR CC/CV controller integrated circuit regulates a power supply output current in the CC mode.

9. The PSR CC/CV controller integrated circuit of claim 8, wherein the PSR CC/CV controller integrated circuit is operable in a program mode, wherein in the program mode the PSR CC/CV controller integrated circuit shifts in bits of information synchronously with a switch signal output by the PSR CC/CV controller integrated circuit.

10. The PSR CC/CV controller integrated circuit of claim 8, wherein the PSR CC/CV controller integrated circuit includes a cord resistance compensation circuit.

11. The PSR CC/CV controller integrated circuit of claim 8, wherein the PSR CC/CV controller integrated circuit includes an efficiency variation compensation circuit.

12. The PSR CC/CV controller integrated circuit of claim 8, wherein the PSR CC/CV controller integrated circuit includes a line input voltage variation compensation circuit.

13. The PSR CC/CV controller integrated circuit of claim 8, wherein the PSR CC/CV controller integrated circuit is operable in a normal mode and a program mode, wherein if the PSR CC/CV controller integrated circuit is operating in the CV mode and if the PSR CC/CV controller integrated circuit is switched from operating in the normal mode to the program mode then the voltage at which the PSR CC/CV controller integrated circuit regulates the power supply output voltage in the CV mode is changed.

14. A method comprising:
    (a) shifting a first value and a second value into a non-volatile shift register in a primary-side regulation constant current/constant voltage (PSR CC/CV) controller integrated circuit, wherein the first value is usable by the PSR CC/CV controller integrated circuit to set a power supply regulated output voltage to which the PSR CC/CV controller integrated circuit regulates in a constant voltage (CV) mode, wherein the second value is usable by the PSR CC/CV controller integrated circuit to set a power supply regulated output current to which the PSR CC/CV controller integrated circuit regulates in a constant current (CC) mode.

15. The method of claim 14, wherein the PSR CC/CV controller integrated circuit is a part of an operating power supply during the shifting of (a).

16. The method of claim 14, further comprising:
    (b) shifting a third value into the non-volatile shift register, wherein the PSR CC/CV controller integrated circuit includes an input voltage variation compensation circuit, and wherein the third value is used to set the input voltage variation compensation circuit.

17. The method of claim 14, further comprising:
    (b) causing the PSR CC/CV controller integrated circuit to enter a program mode such that the PSR CC/CV controller integrated circuit changes the power supply regulated output voltage to which the power supply regulates the power supply output voltage in the constant voltage (CV) mode; and
    (c) using the changed power supply regulated output voltage to program the first and second values into the non-volatile shift register.

18. The method of claim 16, further comprising:
    (c) testing a power supply and obtaining therefrom test data, wherein step (c) occurs before steps (a) and (b), wherein the PSR CC/CV controller integrated circuit is a part of the power supply; and (d) using automatic test equipment (ATE) to determine the third value based at least in part on the test data, wherein step (d) occurs after step (c) but before steps (a) and (b).

19. The method of claim 14, further comprising:
(b) shifting a third value into the non-volatile shift register, wherein the PSR CC/CV controller integrated circuit includes an efficiency variation compensation circuit, and wherein the third value is used to set the efficiency variation compensation circuit.

20. The method of claim 19, further comprising:
(c) testing a power supply and obtaining therefrom test data, wherein step (c) occurs before steps (a) and (b), wherein the PSR CC/CV controller integrated circuit is a part of the power supply; and
(d) using automatic test equipment (ATE) to determine the third value based at least in part on the test data, wherein step (d) occurs after step (c) but before steps (a) and (b).

21. The method of claim 14, further comprising:
(b) shifting a third value into the non-volatile shift register, wherein the PSR CC/CV controller integrated circuit includes a cord resistance compensation circuit, and wherein the third value is used to set the cord resistance compensation circuit.

22. The method of claim 21, further comprising:
(c) testing a power supply and obtaining therefrom test data, wherein step (c) occurs before steps (a) and (b), wherein the PSR CC/CV controller integrated circuit is a part of the power supply; and
(d) using automatic test equipment (ATE) to determine the third value based at least in part on the test data, wherein step (d) occurs after step (c) but before steps (a) and (b).

23. A method comprising:
(a) operating a primary-side regulation (PSR) power supply and obtaining therefrom test data, wherein the PSR power supply includes an integrated circuit and a transformer, wherein the integrated circuit includes a PSR controller; and
(b) programming information into integrated circuit while the PSR power supply is operating, wherein (b) occurs after the obtaining of the test data of (a).

24. The method of claim 23, wherein the integrated circuit is a packaged integrated circuit, and wherein (a) and (b) occur after a final test of the packaged integrated circuit before the packaged integrated circuit is assembled with the transformer to form the PSR power supply.

25. An integrated circuit comprising:
a non-volatile storage circuit that stores a first value and a second value; and
means for regulating an output of a primary-side regulation constant current/constant voltage (PSR CC/CV) power supply, wherein the first value is a factor in setting a regulated output voltage at which the output is regulated in a constant voltage (CV) mode of the power supply, and wherein the second value is a factor in setting a regulated output current at which the output is regulated in a constant current (CC) mode of the power supply.

26. The integrated circuit of claim 25, wherein the means is also for changing the regulated output voltage when the means is operating in a program mode, wherein the changed regulated output voltage is used to program the non-volatile storage circuit.

27. A primary-side regulation (PSR) controller integrated circuit having an amount of non-volatile rewritable memory, wherein the memory is adapted to store more than two values taken from the group consisting of: a value that sets a constant voltage (CV) mode power supply output voltage, a value that sets a constant current (CC) mode power supply output current, a value that controls an efficiency variation compensation circuit, a value that controls a line input voltage variation compensation circuit, a value that controls a cord resistance compensation circuit, a value that controls a primary inductance variation compensation circuit, a value that sets a clock frequency within the PSR controller integrated circuit, and a value that sets a voltage reference within the PSR controller integrated circuit.

* * * * *